United States Patent [19]

Ohuchi

[11] Patent Number: 6,107,164
[45] Date of Patent: Aug. 22, 2000

[54] USING GROOVES AS ALIGNMENT MARKS WHEN DICING AN ENCAPSULATED SEMICONDUCTOR WAFER

[75] Inventor: Shinji Ohuchi, Tokyo, Japan

[73] Assignee: Oki Electric Industry Co., Ltd., Tokyo, Japan

[21] Appl. No.: 09/184,836

[22] Filed: Nov. 3, 1998

[30] Foreign Application Priority Data

Aug. 18, 1998 [JP] Japan ................... 10-231894

[51] Int. Cl.$^7$ ................... H01L 21/78
[52] U.S. Cl. ................... 438/465; 438/462; 438/114; 438/127; 438/113; 438/110
[58] Field of Search ................... 438/106, 110, 438/113, 759, 114, 127, DIG. 975, 462, 465; 451/388, 283, 285, 289, 390

[56] References Cited

U.S. PATENT DOCUMENTS

| | | |
|---|---|---|
| 4,904,610 | 2/1990 | Shyr . |
| 5,393,706 | 2/1995 | Mignardi et al. . |
| 5,445,559 | 8/1995 | Gale et al. . |
| 5,516,728 | 5/1996 | Degani et al. . |
| 5,527,744 | 6/1996 | Mignardi et al. . |
| 5,605,489 | 2/1997 | Gale et al. . |
| 5,888,883 | 4/1998 | Sasaki et al. . |

FOREIGN PATENT DOCUMENTS

| | | |
|---|---|---|
| 54-045570 | 4/1979 | Japan . |
| 61-150268 | 7/1986 | Japan . |
| 10050772 | 2/1998 | Japan . |
| 10-223571 | 8/1998 | Japan . |

*Primary Examiner*—Charles Bowers
*Assistant Examiner*—Evan Pert
*Attorney, Agent, or Firm*—Jones Volentine, L.L.P.

[57] ABSTRACT

Described herein is a method of manufacturing a semiconductor device according to the invention of the present application. According to the method, protruded electrodes are formed on a plurality of chip areas of a wafer having the plurality of chip areas on the surface thereof. Grooves are defined in boundary regions of the plurality of chip areas. Thereafter, the surface of the wafer with the grooves defined therein is covered with a resin. The back of the wafer is polished to expose the grooves from the back thereof. Next, the wafer is divided into pieces at the exposed groove portions. Since the grooves are bare from the back of the wafer in this way, the positions where the wafer is divided into the pieces, can be recognized with ease and reliability.

17 Claims, 6 Drawing Sheets

USING GROOVES AS ALIGNMENT MARKS WHEN DICING AN ENCAPSULATED SEMICONDUCTOR WAFER

BACKGROUND OF THE INVENTION

1. Field of the Invention

This invention relates to a plastic molded type semiconductor device and a method of manufacturing the semiconductor device, and particularly to a semiconductor device wherein sealing is performed in a wafer state and a method of manufacturing the semiconductor device.

2. Description of the Related Art

Portable devices have rapidly come into wide use in recent years. Correspondingly, plastic molded type semiconductor devices mounted therein need to be brought into less thickness, size and weight. A vast number of semiconductor devices have been proposed to cope with these constraints.

A chip size package (hereinafter called "CSP") formed in a size similar to that for a semiconductor chip has been developed as such a technique.

The following method is known as one example of a method for forming a CSP. Protruded electrodes are respectively formed over electrode pads in individual device areas in a wafer state. Next, the entire surface of the wafer with the protruded electrodes formed thereon is sealed with a resin and the resin is polished until the protruded electrodes are exposed after the curing of the resin. Thereafter, the CSP is formed in accordance with a process for dividing the CSP into individual chips.

A technique disclosed in Japanese Patent Application Laid-Open No. Hei 10-50772 is known as one example of a reference which discloses such a technique.

SUMMARY OF THE INVENTION

With the foregoing in view, it is therefore an object of the present invention to provide a method of manufacturing a semiconductor device, which is capable of easily and accurately recognizing CSP dividing positions when a CSP formed in a wafer state is divided into pieces.

According to one aspect of this invention, for achieving the above object, there is provided a method of manufacturing a semiconductor device. According to the present method, protruded electrodes are formed on a plurality of chip areas of a wafer having the plurality of chip areas on the surface thereof, and grooves are defined in boundary regions of the plurality of chip areas. Thereafter, the surface of the wafer with the grooves formed therein is covered with a resin. The back of the wafer is polished so as to expose the grooves from the back thereof. Next, the wafer is divided into pieces at the exposed groove portions.

Typical examples of various embodiments of the present invention have been shown in brief. However, the various embodiments of the present invention and specific configurations of these embodiments will be understood from the following description.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

A structure of a semiconductor device obtained from the invention of the present application will first be described with reference to FIG. 1.

Figure 1:
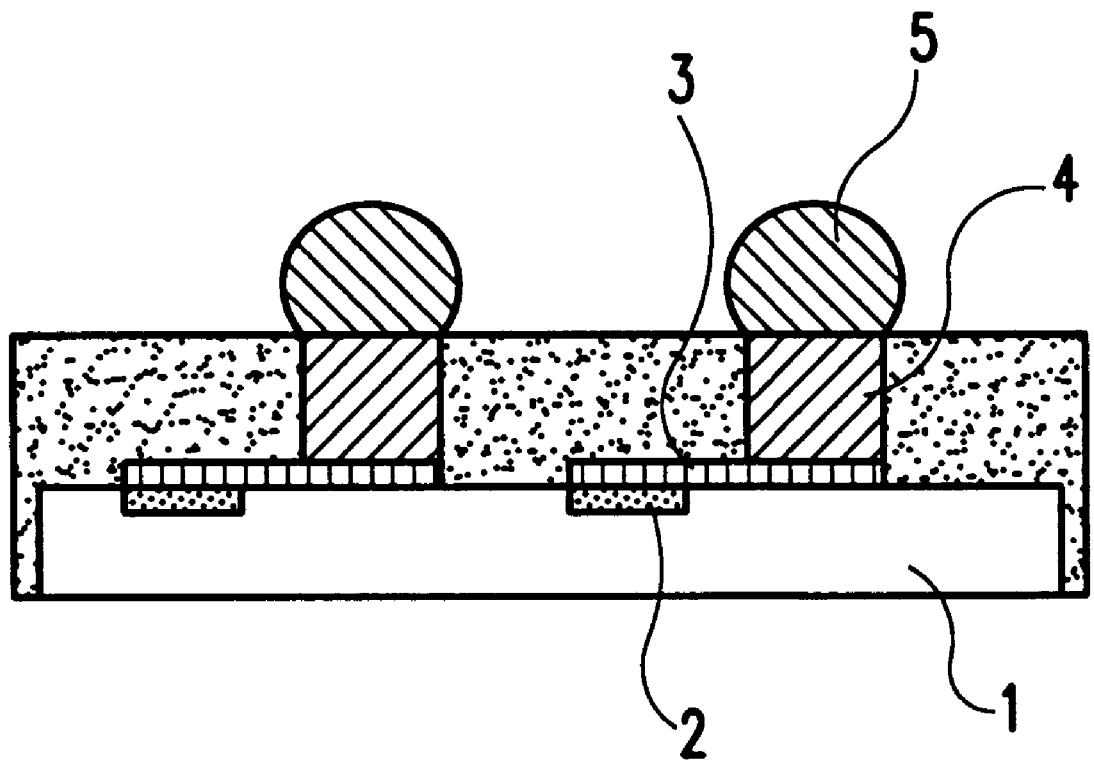
FIG. 1 is a diagram showing a first embodiment of the present invention.

In FIG. 1, aluminum electrodes 2 are formed over a semiconductor chip 1. The aluminum electrodes 2 are respectively electrically connected to conductive protruded electrodes, e.g., posts 4 composed of copper through conductive layers, e.g., copper interconnections or wires 3. Further, the aluminum electrodes 2 are electrically connected to an unillustrated integrated circuit formed on the semiconductor chip 1. The aluminum electrodes 2 are bare from openings defined in a protective coat or film for protecting each element or device area, such as a nitride film which serves as an unillustrated protective film. The wires 3 and posts 4 are formed over the protective film. Metal electrodes 5 such as solder balls are respectively formed over the surfaces of the posts 4.

A method of manufacturing the semiconductor device shown in FIG. 1 will be explained below.

A process for forming each of posts 4 over a wafer 10 will first be described using FIGS. 2(a) through 2(d).

Figure 2A:
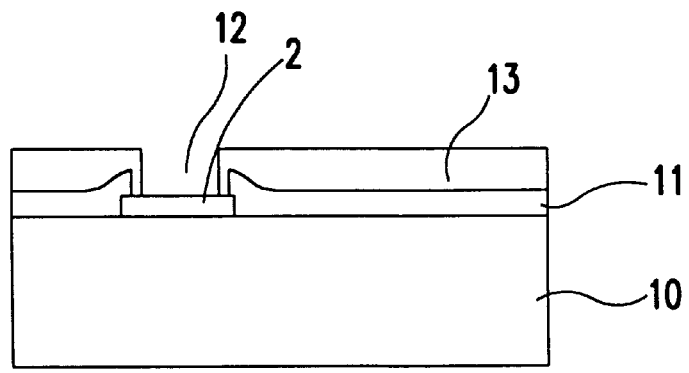
FIGS. 2A–2D are diagrams for describing a manufacturing process employed in the first embodiment of the present invention.

As shown in FIG. 2(a), an interlayer film 13 composed of, for example, polyimide or the like, which has an opening 12 on an electrode 2, is formed over the wafer 10 on which the electrode 2 and a passivation film 11 are formed.

Figure 2B:
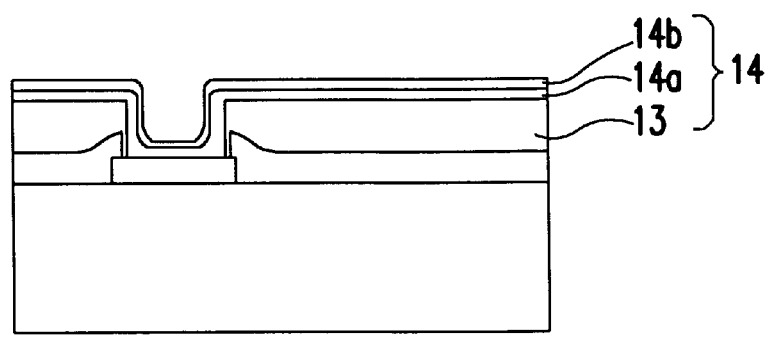

Next, a plating electrode 14 is formed over the entire surface of the wafer 10 as shown in FIG. 2(b). As the plating electrode, for example, titanium 14a and copper 14b are successively formed by sputtering.

Figure 2C:
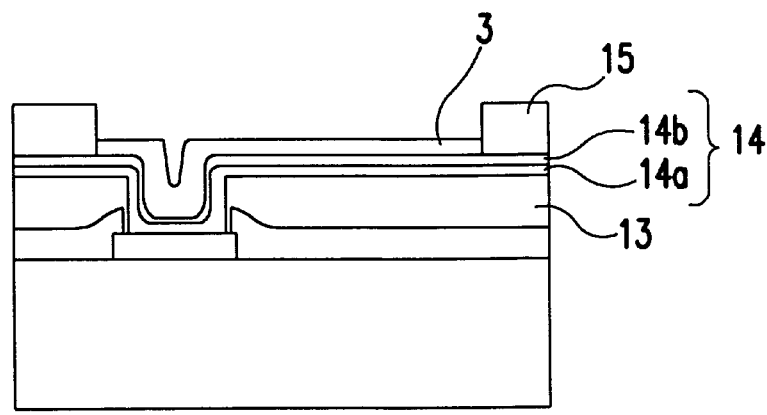

Resists 15 are formed on the plating electrode 14 to remove areas corresponding to the wires 3, of the resists 15. As shown in FIG. 2(c), a wire 3 composed of copper, which has a thickness of about 5 $\mu$m, is formed in the resist-removed area by electrolytic plating. The wire 3 is formed to a width of about 5 $\mu$m.

Figure 2D:
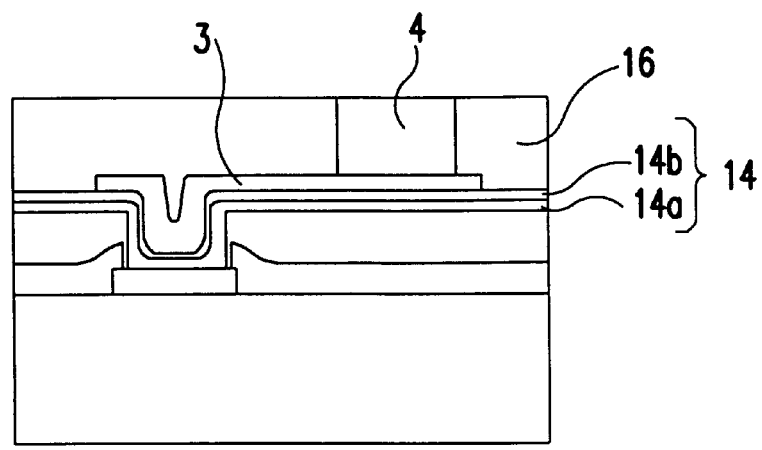

After the removal of the resists 15, a film-shaped resist 16 having a thickness of about 100 $\mu$m is placed over the entire surface of the wafer 10 with the corresponding wire 3 formed thereon, whereby an opening is defined in a position for connection with the formed wire 3. As shown in FIG. 2(d), each post 4 composed of copper, whose diameter ranges from about 200 $\mu$m to 250 $\mu$m and whose thickness ranges from about 100 $\mu$m to 150 $\mu$m, is formed in the corresponding opening by electrolytic plating. After the formation of the post 4, the film-like resist 16 is removed.

A process for sealing a wafer with posts 4 formed thereon with a resin and dividing the wafer into pieces will be explained below with reference to FIGS. 3(a) through 3(d) and FIGS. 4(a) through 4(c).

Figure 3A:
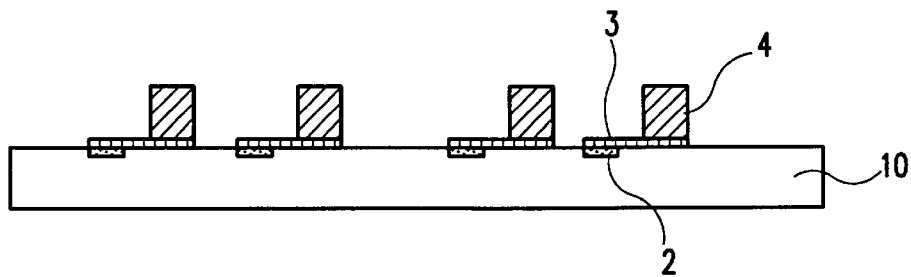
FIGS. 3A–3D are diagrams for describing another manufacturing process employed in the first embodiment of the present invention.

FIG. 3(a) shows the wafer from which the film-shaped resist 16 has been removed after the completion of the process step in FIG. 2(d). In FIG. 3(a), the passivation film 11, the protective film 13 and the plating electrode 14 shown in FIG. 2 (d) are omitted from the drawing and only the electrodes 2, wires 3 and posts 4 are disclosed.

Figure 3B:
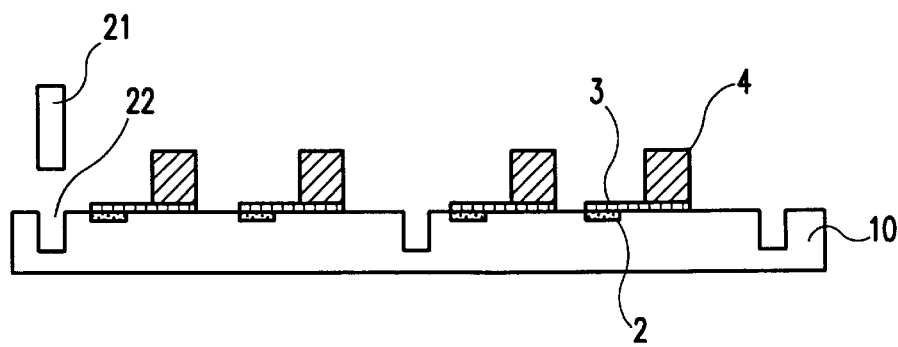

The wafer 10 with such posts 4 formed thereon is cut between respective semiconductor elemental devices by a blade 21 such as a diamond blade or the like to thereby define grooves 22 as shown in FIG. 3(b). The thickness of the blade 21 is set to a thickness of about 35 μm and the width of each groove 22 is set to about 35 μm, for example. The groove 22 is deeper in depth than half the thickness of the wafer 10 and may preferably be set to a depth equal to about two-third the depth of the wafer 10. If the groove 22 is excessively made deep, then the wafer 10 would be divided into pieces in this state. If the depth of each groove 22 is insufficient, then there is a possibility that a crack will be produced in each groove due to resin contraction at resin sealing. If the thickness of the wafer 10 is set as 600 μm, for example, then the depth of each groove may preferably be about 400 μm.

Figure 3C:
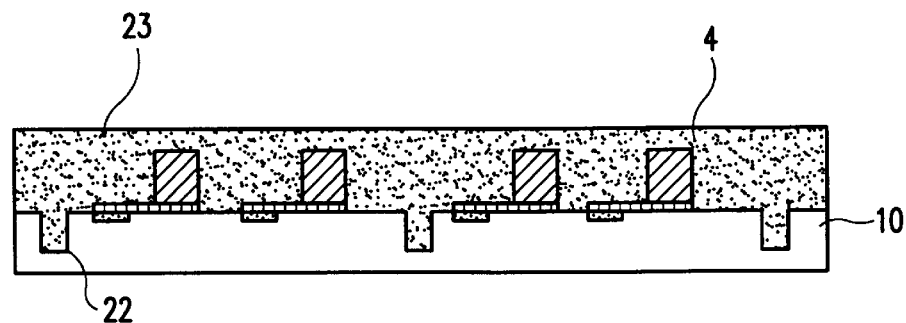

Next, the surface of the wafer 10 is sealed with a resin 23 as shown in FIG. 3(c). The resin 23 is formed to such a thickness as to cover each post 4 as a thickness of the order of 50 μm, e.g., a thickness of about 150 μm.

Figure 3D:
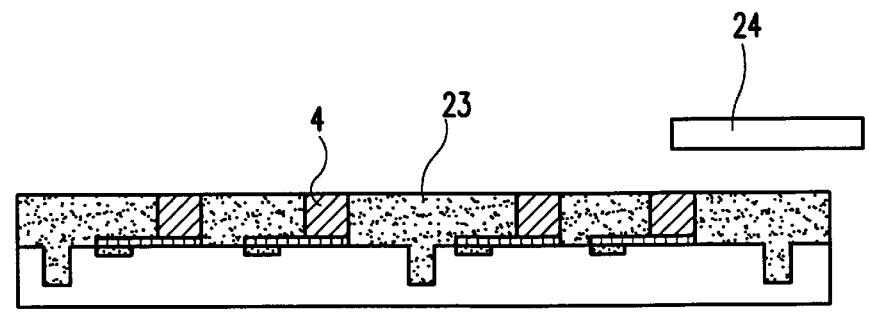

After the surface of the wafer 10 has been sealed with the resin 23 and the resin 23 has been cured, the surface of the resin 23 is polished by a polishing blade 24 to expose the posts 4 as shown in FIG. 3(d). The resin is formed over each post 4 with a thickness of the order of 50 μm. In order to make the posts 4 bare completely, the resin may be polished by the order of about 60 μm to 70 μm.

Figure 4A:
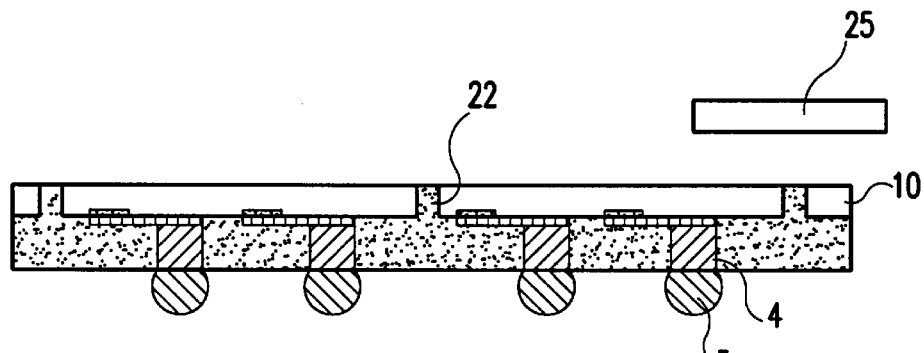
FIGS. 4A–4C are diagrams for describing a further manufacturing process employed in the first embodiment of the present invention.
Figure 4B:
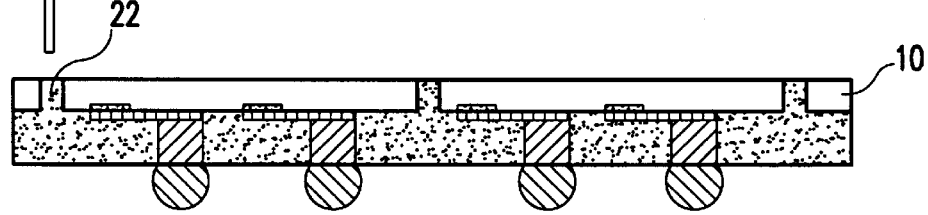

Thereafter, the back of the wafer 10 is polished by a polishing blade 25 as shown in FIG. 4(a). At this time, the thickness to be polished is set so as to range from 300 μm to 400 μm to form the thickness of a chip for each completed device in a range of 200 μm to 300 μm. Thus, the grooves 22 are completely exposed from the back of the wafer 10.

In this condition, metal electrodes 5 such as solder balls or the like are formed over the surfaces of the exposed posts 4 respectively.

Figure 4C:
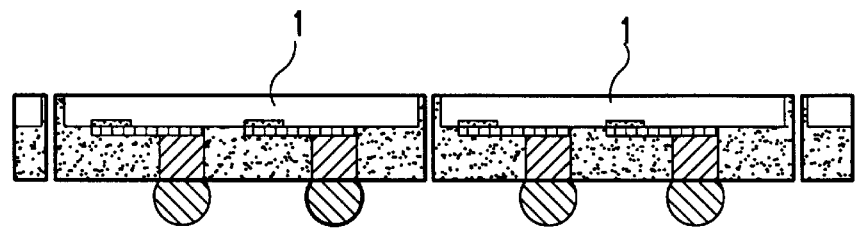

The wafer 10 is cut away from the back thereof by using a blade 26 such as a diamond blade with the grooves 22 exposed to the back of the wafer 10 as marks. The blade 26 is thinner than the blade 21 used in the process step shown in FIG. 3(b). One having a thickness of about 25 μm, for example, is used as the blade 26. Thus, semiconductor devices can be obtained wherein the sides of each individual chips 1 shown in FIG. 4(c) are sealed with the resin.

Although the resin 23 has been charged into the grooves 22 in the process step shown in FIG. 3(c), for example, a resin high in viscosity is used as the resin 23 and the surface of the wafer 10 may be sealed with the high viscosity resin so that the resin is not left within the grooves 22.

Further, when the back of the wafer 10 is polished to make the grooves 22 bare after the curing of the resin, the respective chips are divided into pieces in a state in which their surfaces are in contact with the resin. Since no resin is charged into the grooves in this case, warpage of the resin-sealed wafer due to the contraction of the resin is reduced.

Figure 5:
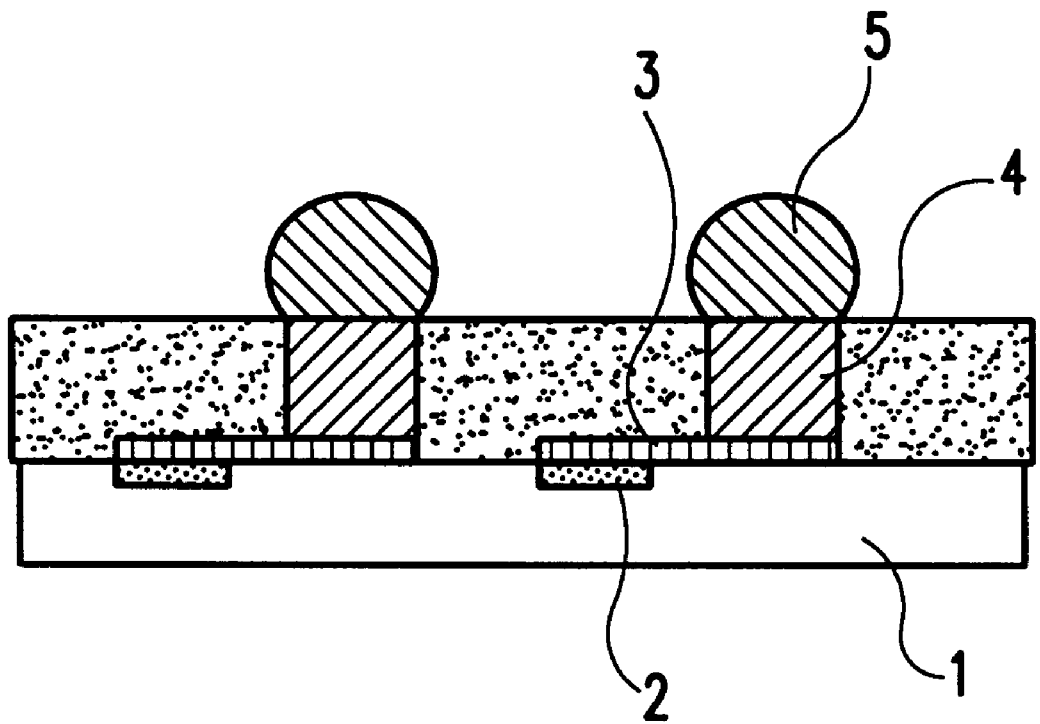
FIG. 5 is a diagram illustrating a modification of the first embodiment of the present invention.

When the chips are divided into pieces after the resin seal has been carried out so that no resin is charged into the grooves 22, a semiconductor device is obtained wherein the sides of the chip 1 are bare as shown in FIG. 5.

Figure 6:
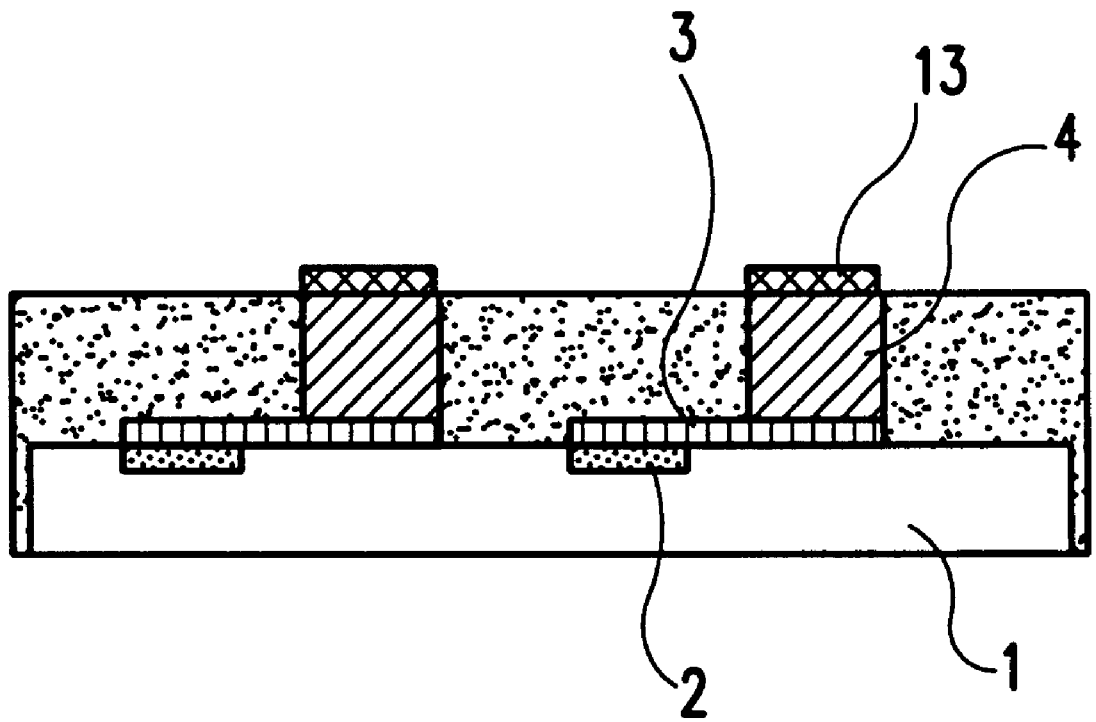
FIG. 6 is a diagram showing another modification of the first embodiment of the present invention.

In the process step shown in FIG. 4(a), the wafer 10 may be divided into pieces without the formation of the metal electrodes 5 on the posts 4. In this case, layered films 13 each composed of nickel and gold are formed on their corresponding posts 4 by electroless plating as shown in FIG. 6 to prevent corrosion of the exposed surfaces of the posts 4, so that a metal electrode-free type semiconductor device can be obtained. This type of semiconductor device can be implemented on a mounted substrate by superimposing the posts 4 on solder or the like formed on the substrate.

In the first embodiment, as shown in FIG. 3(d) and 4(a), the resin 23 formed over the surface of the wafer 10 is polished so as to expose the posts 4. Thereafter, the back of the wafer 10 is polished to expose the grooves 22 from the back of the wafer 10. However, the sequence of these may be changed. Namely, the back of the wafer 10 is first polished so as to expose the grooves 22 from the back of the wafer 10. Thereafter, the resin 23 may be polished so as to make the posts 4 bare. Since the wafer 10 is in a state of having already been divided into pieces of chips upon polishing of the resin 23 when done in this way, the warpage of the wafer due to the difference in contraction stress between the wafer and the resin can be reduced.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments that fall within the true scope of the invention.

What is claimed is:

1. A method of manufacturing a semiconductor device, comprising:

forming electrodes on a plurality of chip areas of a wafer having said plurality of chip areas on an upper surface thereof and having a lower surface opposing said upper surface;

forming grooves in boundary regions of said plurality of chip areas;

covering said upper surface of said wafer with the grooves formed therein with a resin;

polishing said lower surface so as to expose the grooves in the upper surface of the wafer from the back thereof; and dividing the wafer into pieces from the lower surface of the wafer using the grooves exposed from the lower surface of the wafer as marks, wherein the grooves are not exposed from the upper surface of the wafer.

2. The method according to claim 1, wherein said grooves are defined deeper than half the thickness of said wafer, but are not deeper than the thickness of said wafer.

3. The method according to claim 1, wherein said forming of the grooves includes using a first blade and said cutting of the wafer includes using a second blade, the second blade being thinner than the first blade.

4. The method according to claim 1, wherein said sealing comprises using a resin of sufficient viscosity such that the resin covers and fills the grooves.

5. The method according to claim 1, wherein said sealing comprises using a resin of sufficient viscosity such that the resin covers, but does not fill the grooves.

6. The method according to claim 1, wherein said forming of the grooves and said cutting of the wafer includes using a blade.

7. The method according to claim 6, wherein the blade is a diamond blade.

8. The method according to claim 1, wherein said electrodes are protruded electrodes extending above the upper surface of the wafer at discrete portions thereof.

9. The method according to claim 8, wherein said sealing of the wafer surface includes providing sufficient resin such that upper surfaces of the protruded electrodes are no longer discernable from the upper surface of the wafer surface after said sealing.

10. A method of manufacturing a semiconductor device, comprising:

forming plated wires with one end of each wire connected to one of a plurality of first electrodes, each plated wire being positioned on a protective film of a wafer containing a plurality of semiconductor elemental devices, each device being comprised of circuit elements, wherein the plurality of first electrodes are connected to said circuit elements and wherein the protective film for exposing the first electrodes and covering said circuit elements is formed over an upper surface of said wafer having an opposing bottom surface;

forming a second electrode at each of the other ends of the plated wires;

forming grooves between said plurality of semiconductor elemental devices on said upper surface;

sealing said upper surface including said second electrodes with a resin;

polishing said bottom surface to expose said grooves from the bottom surface; and cutting said wafer while viewing the bottom surface of the wafer by using the grooves exposed from the bottom surface of the wafer as guide marks, wherein the grooves are not exposed on the upper surface of the wafer.

11. The method according to claim 10, wherein said forming of the grooves includes using a first blade and said cutting of the wafer includes using a second blade, the second blade being thinner than the first blade.

12. The method according to claim 10, wherein said sealing comprises using a resin of sufficient viscosity such that the resin covers, but does not fill the grooves.

13. The method according to claim 10, wherein said sealing comprises using a resin of sufficient viscosity such that the resin covers and fills the grooves.

14. The method according to claim 10, wherein said forming of the grooves and said cutting of the wafer includes using a blade.

15. The method according to claim 14, wherein the blade is a diamond blade.

16. The method according to claim 10, wherein said second electrodes are protruded electrodes extending above the upper surface of the wafer at discrete portions thereof.

17. The method according to claim 16, wherein said sealing of the wafer surface includes providing sufficient resin such that upper surfaces of the protruded electrodes are no longer discernable from the upper surface of the wafer surface after said sealing.

* * * * *